United States Patent
Cadwallader (12)

(10) Patent No.: US 6,205,647 B1
(45) Date of Patent: Mar. 27, 2001

(54) METHOD OF MAKING A SURFACE MOUNTABLE ELECTRONIC DEVICE

(75) Inventor: James J. Cadwallader, Hamburg, NY (US)

(73) Assignee: American Precision Industries Inc., Buffalo, NY (US)

(*) Notice: Subject to any disclaimer, the term of this patent is extended or adjusted under 35 U.S.C. 154(b) by 0 days.

(21) Appl. No.: 09/286,720

(22) Filed: Apr. 6, 1999

Related U.S. Application Data

(62) Division of application No. 08/769,775, filed on Dec. 18, 1996, now Pat. No. 5,896,077.

(51) Int. Cl.[7] .................................................. H01F 41/06
(52) U.S. Cl. ............................ 29/605; 29/602.1; 29/618; 336/192
(58) Field of Search ......................... 29/605, 606, 602.1, 29/618; 336/192, 208, 198, 165; 338/324, 329, 333; 361/772, 773, 776, 821

(56) References Cited

U.S. PATENT DOCUMENTS 5,446,958 * 9/1995 Hoang .

* cited by examiner

Primary Examiner—Carl E. Hall
(74) Attorney, Agent, or Firm—Hodgson, Russ, Andrew, Woods & Goodyear LLP

(57) ABSTRACT

A surface mountable electronic device comprising a body incorporating an electronic device and having a substantially planar mounting surface and another surface extending from the mounting surface, at least one electrical lead extending from the device, and a terminal of conductive material having a first portion fixedly received in the body and extending through the other surface, a second portion extending from the first portion and electrically connected to the lead and a third portion extending along the mounting surface for providing electrical connection to a circuit. A recess preferably is provided in the other surface of the body for receiving the first portion of the terminal. The recess in the body is elongated to allow positioning of the terminal at selected locations along the recess and to accommodate at least another terminal having a first portion fixedly received in the recess in spaced relation to the first-named terminal, a second portion extending from the first portion for electrical connection to the lead and a third portion extending along the mounting surface for providing electrical connection to a circuit.

11 Claims, 5 Drawing Sheets

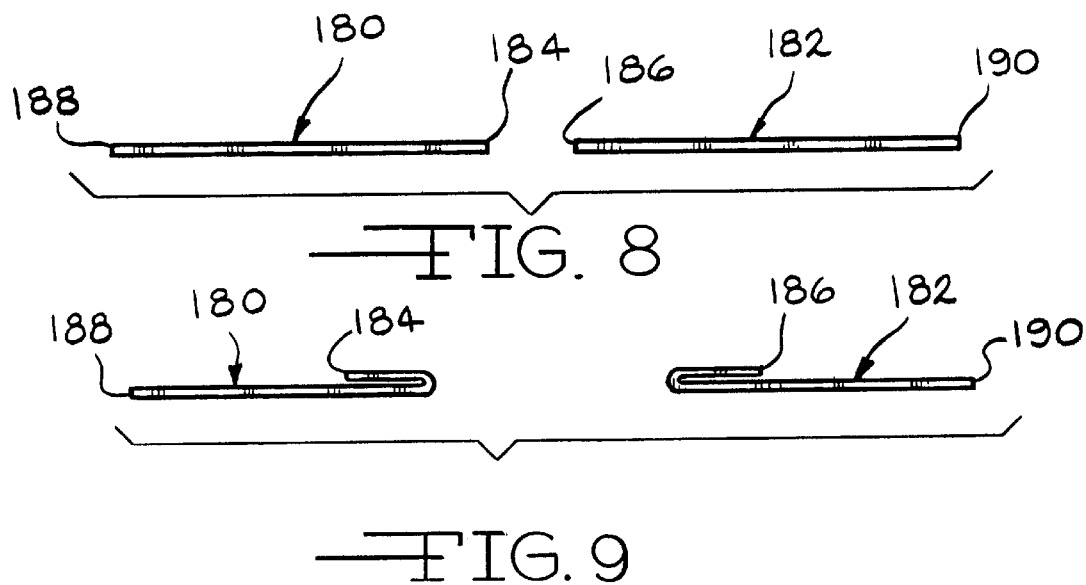
FIG. 8
FIG. 9
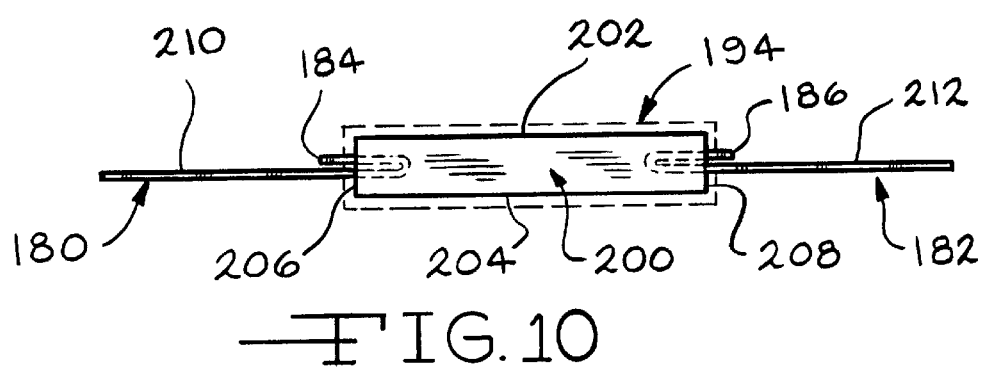
FIG. 10

METHOD OF MAKING A SURFACE MOUNTABLE ELECTRONIC DEVICE

This application is a division of Ser. No. 08/769,775 filed Dec. 18, 1996, U.S. Pat. No. 5,896,077.

BACKGROUND OF THE INVENTION

This invention relates to the art of electronic devices, and more particularly to a new and improved terminal structure for surface mountable electronic devices and a method of making the same.

A principal area of use of the present invention is in surface mountable electronic devices, although the principles of the invention can be variously applied. Surface mountable electronic devices have electrodes or terminals, rather than wire leads, and are mounted directly on the circuit paths of a circuit card, board or substrate thereby avoiding the need for lead-receiving apertures in the cord or board. It would be highly desirable to provide a terminal structure for surface mountable electronic devices wherein a portion of the terminal forms the surface mount lead and another portion of the same terminal is used for connection to the electrical lead of the device. It also would be highly desirable to provide a surface mountable electronic device having flexibility in location of electrodes or terminals and having the capability of including multiple terminals.

SUMMARY OF THE INVENTION

It is therefore a primary object of this invention to provide a new and improved terminal structure for surface mounted electronic devices and a method of making the same.

It is a more particular object of this invention to provide such a terminal structure wherein a portion thereof forms a surface mount lead and another portion thereof is used for electrical connection to an electrical lead of the electronic device.

It is a further object of this invention to provide such a terminal structure which can be placed at selected locations on the device of which it is a part.

It is a further object of this invention to provide such a terminal structure which is readily mountable in multiples thereof on the device of which it is a part.

It is a further object of this invention to provide such a terminal structure which is a relatively simple and convenient and economical to manufacture and install and which also is effective and reliable in operation.

The present invention provides a surface mountable electronic device comprising a body incorporating an electronic device and having a substantially planar mounting surface and another surface extending from the mounting surface, at least one electrical lead extending from the device, and a terminal of conductive material having a first portion fixedly received in the body and extending through the other surface, a second portion extending from the first portion and electrically connected to the lead and a third portion extending along the mounting surface for providing electrical connection to a circuit. Preferably, a recess is provided in the other surface of the body for receiving the first portion of the terminal. The recess in the body is elongated to allow positioning of the terminal at selected locations along the recess and to accommodate at least another terminal having a first portion fixedly received in the recess in spaced relation to the first-named terminal, a second portion extending from the first portion for electrical connection to the lead and a third portion extending along the mounting surface for providing electrical connection to a circuit. In preferred form the terminal comprises a thin flat strip and a substantially U-shaped formation at one end of strip wherein one leg of the U-shaped formation extends along a portion of the strip inwardly from the one end and the other leg is spaced from the strip. The one leg and the end of the strip are received in the body, such as in the recess, and the other leg extends along the mounting surface. A body of material can be provided between one leg and the end of the strip for strengthening the terminal structure. The strip and the U-shaped formation preferably are integral.

The foregoing and additional advantages and characterizing features of the present invention will become clearly apparent upon a reading of the ensuing detailed description together with the included drawing wherein:

BRIEF DESCRIPTION OF THE DRAWING FIGURES

FIGS. 8–13 illustrate a method for making a surface mountable electronic device according to another embodiment of the present invention.

DETAILED DESCRIPTION OF THE ILLUSTRATED EMBODIMENTS

Figure 1:
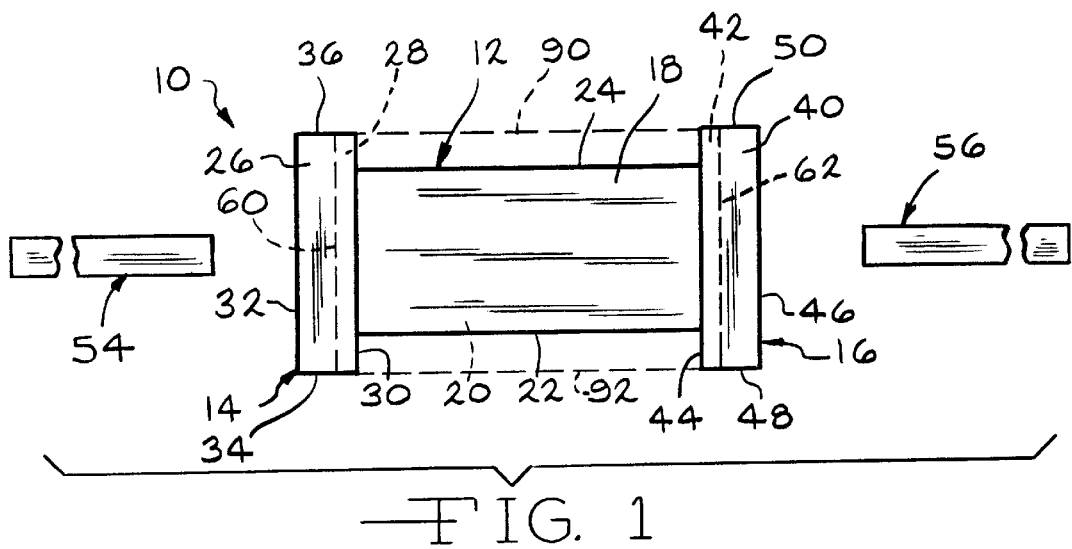
FIG. 1 is a developed top plan view showing a stage in the assembly of a surface mountable electronic device according to the present invention.

The surface mountable electronic device according to the present invention includes a body incorporating an electronic device. In the device shown in FIG. 1, the body comprises a core 10 having a central portion 12 which is bounded at opposite ends by a pair of flanges 14 and 16. In the device according to this embodiment of the present invention core 10 and flanges 14 and 16 are rectangular solid in shape. Thus, core 10 has planar top and bottom surfaces 18 and 20, respectively, joined by side surfaces 22 and 24. In the device shown, core 10 is plate-like in shape having a width several times greater than its thickness. Flange 14 has top and bottom surfaces 26 and 28, respectively, inner and outer end surfaces 30 and 32, respectively, and a pair of side surfaces 34 and 36. Similarly, flange 16 has top and bottom surfaces 40 and 42, respectively, inner and outer end surfaces 44 and 46, respectively, and a pair of side surfaces 48 and 50. The inner end surfaces 30 and 44 of flanges 14 and 16, respectively, extend beyond the width of core 10 as shown in FIG. 1. The side surfaces 34 and 36 of flange 14 and surfaces 48 and 50 of flange 16 are greater in height than the side surfaces 22 and 24 of core 10. The bottom surfaces 28 and 42 of flanges 14 and 16, respectively, collectively provide a mounting surface for the surface mountable device.

The developed view of FIG. 1 shows the device before a pair of terminals 54 and 56 are mounted to the body. To this end flange 14 is provided with a recess 60 in the outer end surface 32 thereof to receive a portion of terminal 54 in a manner which will be shown and described in detail presently. Likewise, flange 16 is provided with a recess 62 in the outer end surface 46 thereof to receive a portion of terminal 56 in a manner which will be shown and described in detail presently.

Figure 2:
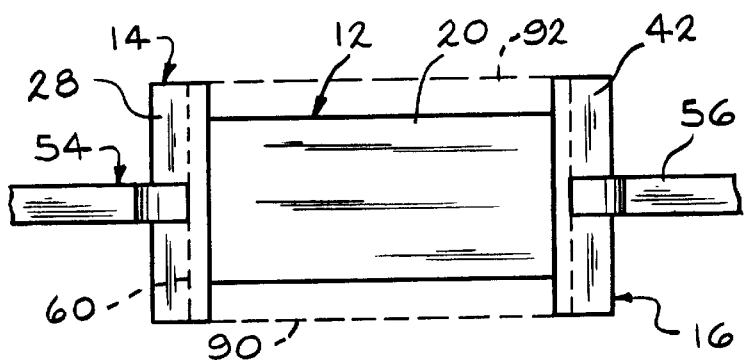
FIG. 2 is a bottom plan view of an assembled surface mountable electronic device according to the present invention.
Figure 3:
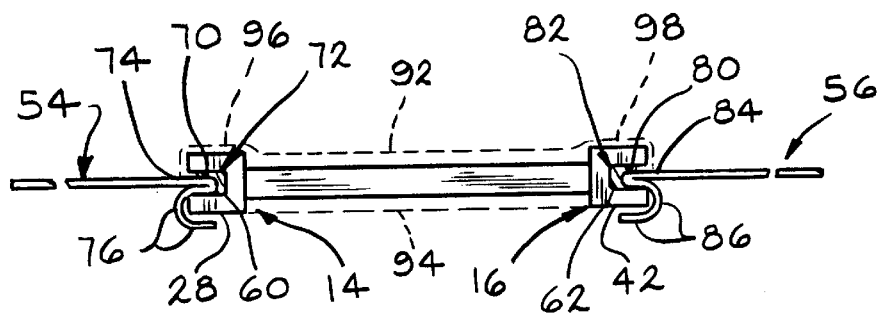
FIG. 3 is a side elevational view of the device of FIG. 2.

FIGS. 2 and 3 show the device after terminals 54 and 56 are mounted to the body. Referring first to terminal 54 it has a first portion 70 fixedly received in recess 60, being held therein by epoxy 72 or like material. Terminal 54 has a second portion 74 extending from the first portion and which is connected electrically to a lead extending from the electronic device incorporated in the body in a manner which will be described. Portion 74 can be trimmed to whatever length is desired. Terminal 54 has a third portion 76 which extends from the first portion 70 and which extends along surface 28 of flange 14, i.e. along the mounting surface of the body, for making electrical connection to a circuit on which the device is surface mounted. The structure of terminal 54 and the method of making the same will be described in further detail presently. While terminal 54 is shown in FIGS. 2 and 3 mounted at a location mid-way along the length of flange 14, the elongated recess 60 provides latitude in selecting the location therealong where terminal 54 is mounted, and enables a plurality of terminals to be mounted therealong as will be explained presently.

Referring now to terminal 56, it likewise has a first portion 80 fixedly received in recess 62, being held therein by epoxy 82 or like material. Terminal 56 has a second portion 84 extending from the first portion and which is connected electrically to a lead extending from the electronic device incorporated in the body in a manner which will be described. Portion 84 can be trimmed to whatever length is desired. Terminal 56 has a third portion 86 which extends from the first portion 80 and which extends along surface 42 of flange 16, i.e. along the mounting surface of the body, for making electrical connection to a circuit on which the device is surface mounted. The structure of terminal 56 and the method of making the same will be described in further detail presently. While terminal 56 is shown in FIGS. 2 and 3 mounted at a location mid-way along the length of flange 16, the elongated recess 62 provides latitude in selecting the location therealong where terminal 56 is mounted, and enables a plurality of terminals to be mounted therealong as will be explained in detail presently.

The shape and dimensions of the end flanges 14 and 16 in relation to the shape and dimensions of core 10 defines a region or volume represented by the broken lines 90, 92 and 94 in FIGS. 1–3 containing a coil of wire wound on core 10 to provide an electronic device in the form of a resistor or an inductor. When the device is a resistor, core 10 is of non-magnetic and electrically resistive material such as epoxy. When the device is an inductor, core 10 can be of ferrite or like magnetic material. Electrical leads shown by broken lines 96 and 98 in FIG. 2 extend from the coil and are connected to the second portions 74 and 84 of terminals 54 and 56, respectively, such as by soldering.

Thus, each of the terminals 54 and 56, by virtue of its structure and its mounting in the corresponding recess 60 and 62, advantageously enables part of the terminal to form the surface mount lead, i.e. the third portions 76 and 86 of the terminals 54 and 56, respectively, while another part of the terminal is used to connect the device terminations or leads to the terminals, i.e. the terminal second portions 74 and 84 connected to leads 96 and 98. The foregoing advantages are coupled with the further advantages of the elongated recesses 60 and 62 co-operating with the terminal first portions 70 and 80 enabling the terminal locations to be selectively varied and multiple terminals to be employed in each recess.

Figure 4:
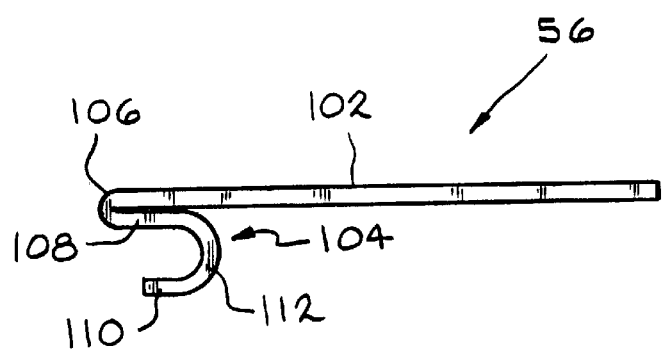
FIG. 4 is an enlarged side elevational view of the terminal structure according to the present invention.

Referring now to FIG. 4 there is shown one of the terminals, for example terminal 56, in further detail, it being understood that terminal 54 is identical. Terminal 56 is of conductive metal in the form of a thin flat strip 102 and a substantially U-shaped formation 104 at one end 106 of strip 102. Preferably strip 102 and U-shaped formation 104 are integral, being formed from the same strip of metal. One leg 108 of U-shaped formation 104 extends along a portion of strip 102 inwardly from end 106, and in the structure shown in FIG. 4 leg 108 extends parallel to and adjacent strip 102. The other leg 110 of formation 104 is joined to leg 108 through a curved base portion 112, and leg 110 extends substantially parallel to and spaced from leg 108 and strip 102. The one leg 108 and the end 106 are fixedly received in recess 62 during assembly of the device as shown in FIG. 2. The upper surface of strip 102 as viewed in FIG. 4 at a location inwardly of end 106 is soldered or otherwise bonded to the end of the electrical lead of the electronic device incorporated in the body. The leg 110 of the U-shaped formation 104 extends along the mounting surface of the device, i.e. along surface 42 of flange 16, for providing electrical connection to a circuit. Leg 110 can be in substantially co-terminal relation with end 106 of strip 102 or, as shown in FIG. 4, it can terminate at a location inwardly of a plane passing through end 106.

By way of example, in an illustrative device, terminal 56 as shown in FIG. 4 comprises a ribbon wire 0.050 inch wide and 0.010 inch thick having one end bent or shaped back upon itself to define the U-shaped formation 104. The distance between parallel planes passing through end 106 and the base of U-shaped formation 104 is about 0.077 inch. The distance between the inner surfaces of legs 108 and 110 is about 0.033 inch. The distance between parallel planes passing through end 106 and the end of leg 110 is about 0.029 inch. In an illustrative terminal structure as shown in FIG. 4 the distance from end 106 to the right-hand end of strip 102 as viewed in FIG. 4 is about 0.973 inch, and the length of strip 102 can be shortened by trimming after assembly. As previously stated, terminal 54 is identical in shape and size to terminal 56.

Figure 5:
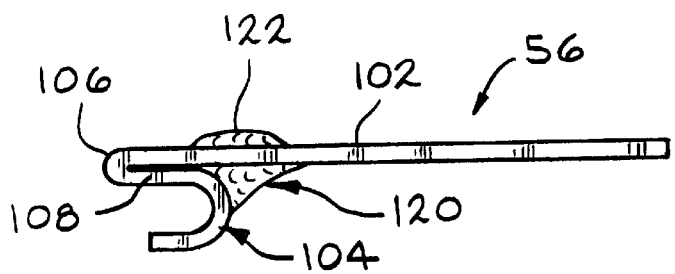
FIG. 5 is a view similar to FIG. 4 showing the addition of strengthening material to the terminal structure.

As shown in FIG. 5, terminal 56 can be provided with a body 120 of material such as a solder fillet between leg 108 of the U-shaped formation 104 and the portion of strip 102 adjacent end 106 to strengthen the terminal structure. The body 120 forms a mechanical support to increase the rigidity of the connection. Terminal 54 likewise can be provided with a body of material in the same location to strengthen the structure. Also shown in FIG. 5 is a body of solder 122 on strip 102 for making electrical connection to the lead (not shown) extending from the electronic device.

Figure 6:
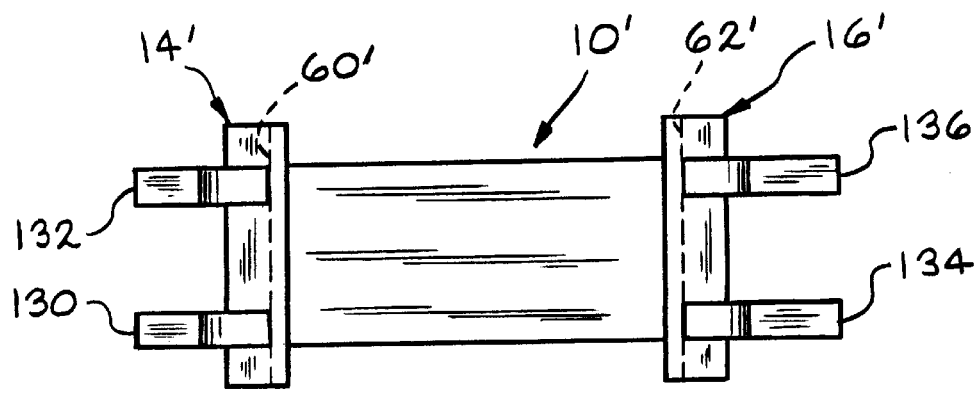
FIG. 6 is a view similar to FIG. 2 showing an alternative embodiment according to the present invention.

As previously mentioned, an advantage of the terminal structure and elongated recess in the device body according to the present invention is that a plurality of terminals can be accommodated. This is illustrated in FIG. 6 which is a view similar to FIG. 2 of a body comprising core 10', flanges 14' and 16' and elongated recesses 60' and 62', in flanges 14' and 16', respectively. The elongated recess 60' receives a pair of terminals 130 and 132 in spaced relation therealong which are identical to terminal 54 of FIGS. 1–6 and which likewise are fixed in recess 60' by epoxy or the like (not shown). Similarly, the elongated recess 62' receives a pair of terminals 134 and 136 in spaced relation therealong which are identical to terminal 56 of FIGS. 1–6 and which likewise are fixed in recess 62' by epoxy or the like (not shown). While two terminals are shown received in each recess 60' and 62' the number is illustrative of various numbers and combinations of terminals depending upon the electrical characteristics and requirements of the device.

Figure 7:
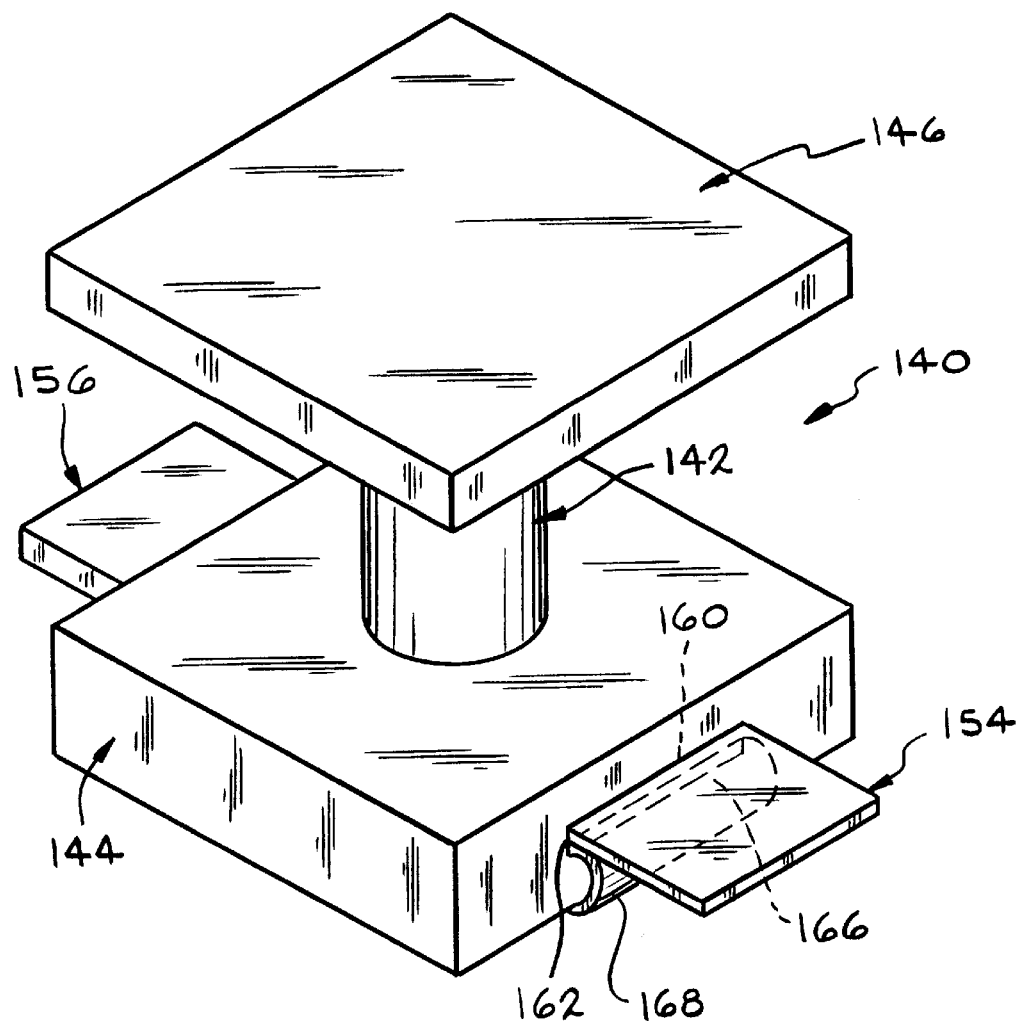
FIG. 7 is a perspective view of a surface mountable electronic device according to another embodiment of the present invention.

FIG. 7 shows a device according to another embodiment of the present invention wherein the central portion of the core is cylindrical in shape, the terminals are mounted on the same flange and each recess is of a length sufficient to accommodate only a single terminal. In particular, core 140 has a cylindrical central portion 142 bounded at opposite axial ends by a pair of plate-like flanges 144 and 146. Flange 144 is thicker than flange 146, otherwise the flanges are identical in dimensions. A pair of terminals 154 and 156 are mounted to flange 144 in a manner similar to that of terminals 54 and 56 in the embodiments of FIGS. 1–6. In particular, terminal 154 has a first portion 160 received in a recess 162 provided in flange 144 and is fixed therein by epoxy or like material (not shown). Recess 162 is of a length sufficient to receive the single terminal 154. Terminal 154 has a second portion 166 extending from the first portion 160 for connection to an electrical lead (not shown) extending from the electronic device incorporated in the body, and portion 166 can be trimmed to whatever length is desired. Terminal 154 has a third portion 168 extending from the first portion and which extends along the outer end surface 10 of flange 144, which is the mounting surface of the body, for making electrical connection to a circuit on which the device is surface mounted. Terminal 154 has the same shape and configuration as terminal 54 in the embodiments of FIGS. 1–6 but is of larger width and can be of greater thickness. Terminal 156 is identical to terminal 154, is fixedly mounted in a similar recess in flange 144 and has a third portion (not shown) extending along flange surface 170 for making electrical connection to the circuit. Alternatively, the first portions of terminals 154 and 156 can be received in flange 144 during molding of core 140 whereby overmolding of flange 144 as the terminal first portions obviates the need for the recesses.

The dimensions and shape of the end flanges 144 and 146 in relation to the shape and dimensions of core 142 define a region or volume containing a coil of wire (not shown) wound on core 142 to provide an electronic device in the form of a resistor or an inductor. When the device is a resistor, core 142 is of non-magnetic and electrically resistive material such as epoxy. When the device is an inductor, core 142 can be of ferrite or like magnetic material. Electrical leads (not shown) extend from the coil and are connected to the second portions of the terminals 154 and 156 such as by soldering.

FIGS. 8–13 illustrate an alternative embodiment of the present invention wherein the terminals are fixed in the body of the device during molding of the body rather than being fixedly received in recesses provided in the body surfaces. A pair of flat, ribbon-like metal terminal lead strips 180 and 182 are provided as shown in FIG. 8 having inner ends 184 and 186, respectively, and outer ends 188 and 190, respectively as viewed in FIG. 8. Formation of the terminal structures is begun by bending the inner ends 184 and 186 of strips 180 and 182, respectively back upon themselves as shown in FIG. 9. Thus, each lead 180 and 182 is provided with a 180° reverse bend.

Next, the two leads 180 and 182 are placed in opposite ends of a mold indicated diagrammatically at 194 in FIG. 10 so that the reverse bends extend into the interior of mold 194 and the ends 184 and 186 of the leads are located outwardly of mold 194. The leads 180, 182 are held in the opposite ends of mold 194 by suitable means in a known manner. Then, resin, epoxy or other suitable moldable material is introduced to mold 194 to form the device body 200 as shown in FIG. 10 in a known manner. The bent portions of leads 180, 182 extending into the interior of mold 194 are encapsulated in body 200 so as to be fixed therein as shown in FIG. 10.

The resulting molded body 200 has a first or upper planar surface 202 as viewed in FIG. 10, a second or bottom planar surface 204 and a pair of end surfaces 206 and 208 joining the surfaces 202 and 204. As shown in FIG. 10, the bent portions of leads 180, 182 are embedded or fixed in body 200, and the remaining portion of each lead or terminal structure extends out through the corresponding end surface 206, 108. In particular, the relatively short ends 184 and 186 of leads 180 and 182, respectively, extend out through body end surfaces 206, 208, respectively, for a relatively short distance. Each lead 180 and 182 has a relatively longer portion 210 and 212, respectively, also extending from body end surfaces 206 and 208 and terminating in the lead ends 188 and 190, respectively.

Figure 11:
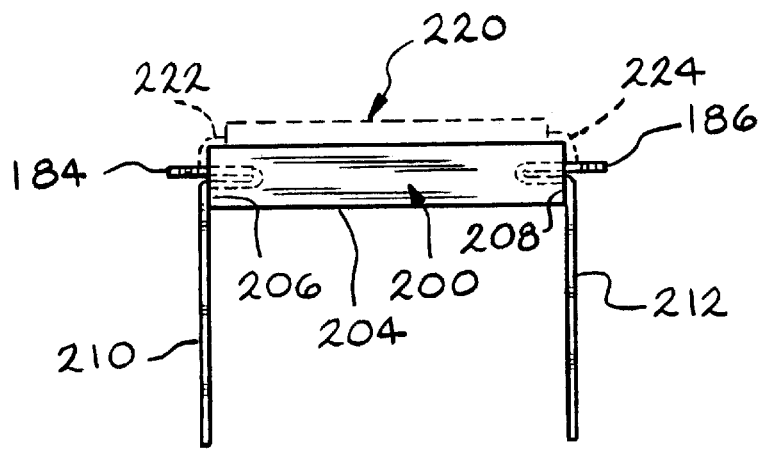
Figure 12:
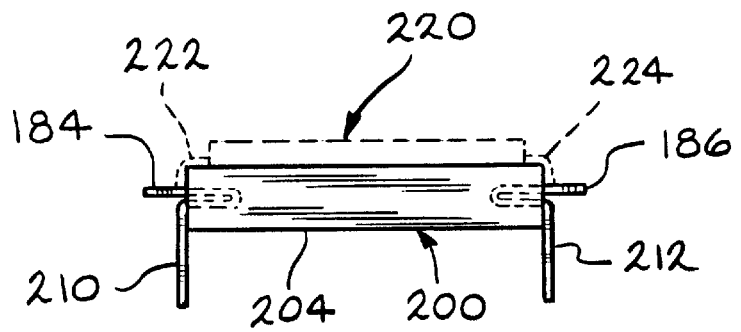
Figure 13:
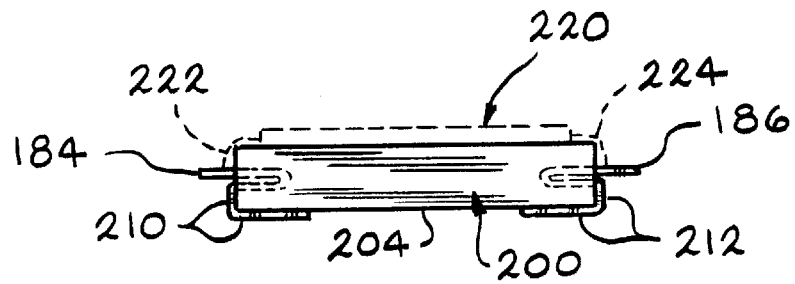

Body 200 and the leads 180, 182 extending therefrom are removed from mold 194, and the next step in forming the terminal structures includes bending the lead portions 210 and 212 to extend along end surfaces 206, 208 toward the bottom surface 204 of body 200 so as to be disposed substantially perpendicular to lead portions 184 and 186, respectively. This is illustrated in FIG. 11. The lead portions 210 and 212 are cut to a desired length shown in FIG. 12 whereupon they are bent to extend along surface 204 as shown in FIG. 13. The bottom surface 204 of body 200 provides a mounting surface for the surface mountable electronic device. The lead portions 210 and 212 extending along surface 204 make electrical connection to a circuit on which the device is surface mounted.

At any stage of the foregoing method after body 200 is removed from mold 194, an electronic device represented diagrammatically at 220 is mounted on body surface 202, for example as shown in FIG. 11. Device 220 has a pair of leads 222 and 224 extending therefrom which are soldering or otherwise connected to lead portions 184 and 186.

As previously described, the material of body 200 can be electrically resistive and non-magnetic, such as epoxy, or can include ferrite or like magnetic material depending upon the nature of the device 220 associated with body 200. The terminal structures shown in the embodiment of FIGS. 8–13 are substantially similar to those of the preceding embodiments, and they are fixed in the body of the device rather than being fixedly received in recesses in the body.

It is therefore apparent that the present invention accomplishes its intended objects. While embodiments of the present invention have been described in detail, that is done for purposes of illustration, not limitation.

What is claimed is:

1. A method for making a surface mountable electronic device comprising:
    a) providing a terminal of conductive material having first, second, and third portions, said first portion being located between said second and third portions;
    b) providing a body having substantially planar mounting surface and another surface extending from said mounting surface;
    c) fixing said first portion of said terminal in said body so as to extend through said another surface with said second and third portions extending from said body substantially perpendicular to said another surface;

d) providing an electronic device in association with said body and having at least one electrical lead extending therefrom;

e) connecting said lead electrically to said second portion of said terminal; and f) extending said third portion of said terminal along said mounting surface of said body for providing electrical connection to a circuit;

g) said providing said body and fixing said first portion of said terminal in said body being performed during a molding operation to form said body.

2. A method according to claim 1, wherein said step of providing said body includes forming a recess in said another surface.

3. A method according to claim 2, wherein said recess is elongated and further including positioning said terminal at a selected location along said recess.

4. A method according to claim 2, wherein said recess is elongated and further including providing another terminal having first, second and third portions, fixing said first portion of said other terminal in said recess in spaced relation to said first-named terminal, connecting said lead electrically to said second portion of said other terminal and extending said third portion of said other terminal along said mounting surface of said body for providing electrical connection to a circuit.

5. A method according to claim 1, wherein said body is a core for the electronic device and wherein said step of incorporating an electronic device comprises winding a coil or said core to provide a resistor or an inductor.

6. A method for making a surface mountable electronic device comprising:

a) providing a terminal of conductive material having first, second, and third portions;

b) providing a body having a substantially planar mounting surface and another surface extending from said mounting surface;

c) fixing said first portion of said terminal in said body so as to extend through said another surface;

d) providing an electronic device in association with said body and having at least one electrical lead extending therefrom;

e) connecting said lead electrically to said second portion of said terminal; and f) extending said third portion of said terminal along said mounting surface of said body for providing electrical connection to a circuit;

g) wherein said providing a terminal comprises providing a thin flat strip having a substantially U-shaped formation at one end of said strip wherein one leg of said U-shaped formation extends along a portion of said strip inwardly from said one end and the other leg is spaced from said strip.

7. A method according to claim 6, wherein said one leg and said end of said strip are fixed in said body, said portion of said strip is electrically connected to said lead and said other leg is extended along said mounting surface for providing electrical connection to a circuit.

8. A method according to claim 6, further including providing a body of material between said one leg and said one end of said strip for strengthening said terminal.

9. A method according to claim 6, wherein said strip and said U-shaped formation are formed from a single piece of material.

10. A method for making a surface mountable electronic device comprising:

a) providing a terminal of conductive material having first, second, and third portions;

b) providing a body having a substantially planar mounting surface and another surface extending from said mounting surface;

c) fixing said first portion of said terminal in said body so as to extend through said another surface;

d) providing an electronic device in association with said body and having at least one electrical lead extending therefrom;

e) connecting said lead electrically to said second portion of said terminal; and f) extending said third portion of said terminal along said mounting surface of said body for providing electrical connection to a circuit;

g) said providing a terminal comprising providing a thin flat strip and a substantially U-shaped formation at one end of said strip wherein one leg of said U-shaped formation extends along a portion of said strip inwardly from said one end and the other leg is spaced from said strip.

11. A method according to claim 10, wherein said one leg and said end of said strip are fixed in said recess, said portion of said strip is electrically connected to said lead and said other leg is extended along said mounting surface for providing electrical connection to a circuit.

* * * * *